(12) United States Patent
Karandikar et al.

(10) Patent No.: US 11,258,450 B2
(45) Date of Patent: Feb. 22, 2022

(54) TECHNIQUES FOR ADDRESSING PHASE NOISE AND PHASE LOCK LOOP PERFORMANCE

(71) Applicant: Intel Corporation, Santa Clara, CA (US)

(72) Inventors: Niranjan Karandikar, Chandler, AZ (US); Wayne Ballantyne, Chandler, AZ (US); Gregory Chance, Chandler, AZ (US); Simon Hughes, Chandler, AZ (US); Daniel Schwartz, Scottsdale, AZ (US); Nebil Tanzi, Hoffman Estates, IL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/766,921

(22) PCT Filed: Mar. 30, 2018

(86) PCT No.: PCT/US2018/025451
§ 371 (c)(1),
(2) Date: May 26, 2020

(87) PCT Pub. No.: WO2019/190558
PCT Pub. Date: Oct. 3, 2019

(65) Prior Publication Data
US 2021/0021272 A1    Jan. 21, 2021

(51) Int. Cl.
*H03L 7/099* (2006.01)
*H03L 7/091* (2006.01)
(Continued)

(52) U.S. Cl.
CPC ............ *H03L 7/0992* (2013.01); *H03L 7/091* (2013.01); *H03L 7/093* (2013.01); *H03L 7/185* (2013.01); *H03L 2207/50* (2013.01)

(58) Field of Classification Search
CPC ....... H03L 7/0992; H03L 7/091; H03L 7/093; H03L 7/185; H03L 2207/50
See application file for complete search history.

(56) References Cited

U.S. PATENT DOCUMENTS

2008/0012647 A1 *   1/2008   Risbo ...................... H03L 7/093
                                                          331/16
2008/0043818 A1     2/2008   Tai et al.
(Continued)

FOREIGN PATENT DOCUMENTS

DE    112018007419 T5    12/2020

OTHER PUBLICATIONS

"International Application Serial No. PCT/US2018/025451, International Preliminary Report on Patentability dated Oct. 15, 2020", 13 pgs.

(Continued)

*Primary Examiner* — Freshteh N Aghdam
(74) *Attorney, Agent, or Firm* — Schwegman Lundberg & Woessner, P.A.

(57) ABSTRACT

Techniques are provided for reducing or mitigating phase noise of a digital phase lock loop or the system depending on the digital phase lock loop. In an example, a multiple-mode digital phase lock loop can include a digital phase lock loop (DPLL), multiple frequency scalers configured to receive a reference clock, and a multiplexer configured to receive a mode command signal and to couple an output of one of the multiple frequency scalers to an input of the DPLL in response to a state of the mode command signal.

13 Claims, 13 Drawing Sheets

(51) Int. Cl.
*H03L 7/093* (2006.01)
*H03L 7/185* (2006.01)

(56) References Cited

U.S. PATENT DOCUMENTS

| | | |
|---|---|---|
| 2009/0163165 A1 | 6/2009 | Oomoto |
| 2011/0081880 A1 | 4/2011 | Ahn |
| 2011/0285433 A1 | 11/2011 | Hezar et al. |
| 2013/0260763 A1 | 10/2013 | Bhattad et al. |
| 2015/0311908 A1* | 10/2015 | Laaja ................. H03L 7/093 327/159 |
| 2018/0254774 A1* | 9/2018 | Thijssen ............. H03L 7/0805 |
| 2019/0052452 A1* | 2/2019 | Perlmutter .......... H03L 7/093 |
| 2019/0268008 A1* | 8/2019 | Khoury ............... H03L 7/0995 |

OTHER PUBLICATIONS

"International Application Serial No. PCT/US2018/025451, International Search Report dated Dec. 26, 2018", 3 pgs.
"International Application Serial No. PCT/US2018/025451, Written Opinion dated Dec. 26, 2018", 11 pgs.

* cited by examiner

TECHNIQUES FOR ADDRESSING PHASE NOISE AND PHASE LOCK LOOP PERFORMANCE

This patent application is a U.S. National Stage Filing under 35 U.S.C. 371 from International Application No. PCT/US2018/025451, filed Mar. 30, 2018 and published in English as WO 2019/190558 on Oct. 3, 2019, which is hereby incorporated by reference herein in its entirety.

TECHNICAL FIELD

This document pertains generally, but not by way of limitation, to phase noise of communication systems, and more particularly, to phase noise cancellation and phase lock loop performance selection.

BACKGROUND

In modern wireless communication systems like Wi-Fi, LTE, WiGig, 5G there is a constant desire to increase the data throughput. One of the ways to achieve higher throughput is by increasing radio frequency (RF) signal bandwidth and modulation order. In order to meet similar quality of reception for higher order modulation and bandwidth, links need higher signal-to-noise ratio (SNR)/error vector magnitude (EVM). Phase noise of RF phase lock loops (PLLs) is one of the major contributors to overall EVM and todays PLL's need to meet stringent integrated phase noise (iPN) requirements to meet more demanding EVM targets. Developing better phase noise PLLs is a non-trivial task and can involve higher power dissipation and or area as a penalty.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In certain aspects of the present subject matter, the inventors have recognized and describe a method to equalize PLL phase noise, thus, making phase noise a minor contributor to overall EVM budget. Certain aspects can allow for use of a higher phase noise PLL which can save power and/or area. Some aspects can allow for use of a lower phase noise PLL and relax requirements on other EVM contributors. Conventional techniques for dealing with PLL phase noise attempt to eliminate phase noise by always using sophisticated, large, and energy hungry components.

Figure 1:
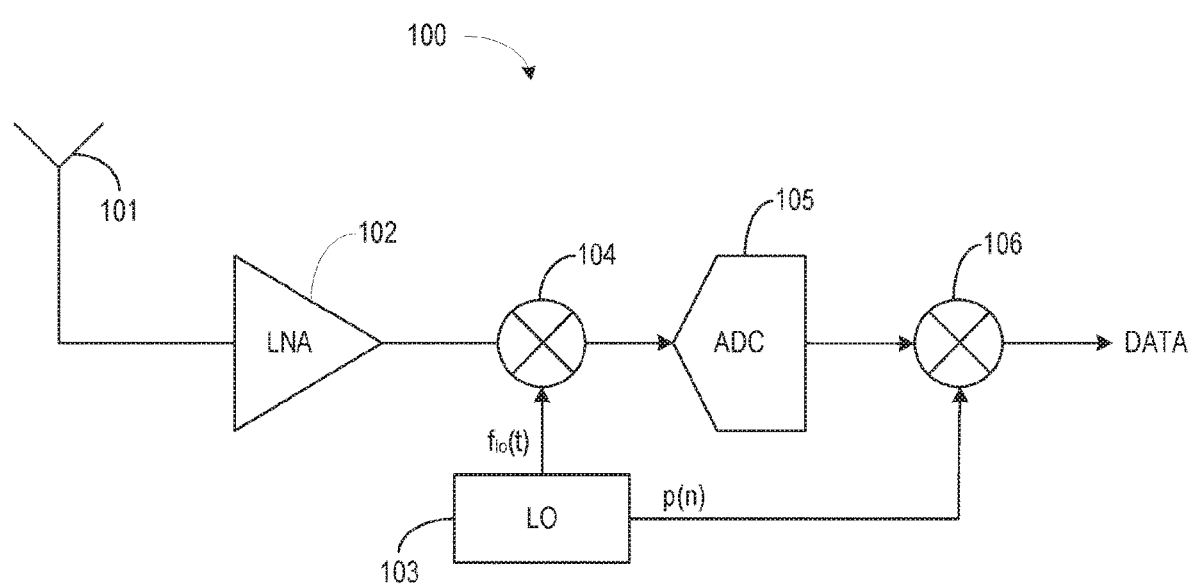
FIG. 1 illustrates generally an example system for addressing phase noise at higher modulation orders such as for millimeter wave (mmW) applications.

FIG. 1 illustrates generally an example system 100 for mitigating or reducing phase noise at higher modulation orders such as for millimeter wave (mmW) applications. The system 100 can include an antenna 101, a low noise amplifier (LNA) 102, a local oscillator generator 103, a first mixer 104, a data converter 105, and a second mixer 106 such as a digital mixer. The antenna 101 can receive wireless signals such as mmW signals. The LNA 102 can amplify the mmW signals. In certain aspects, the LNA 102 can filter the received mmW signals to reject certain frequency components and can amplify frequency components of interest. At the first mixer 104, the mmW signal can be down-converted using a local oscillator signal received from the local oscillator signal generator 103. In certain aspects, the local oscillator signal generator 103 can include a phase lock loop (PLL). In some examples, the local oscillator generator 103 can include a digital phase lock loop (DPLL) or an all-digital phase lock loop (ADPLL). In certain aspects, the local oscillator signal ($f_{lo}(t)$) can be represented as, $$f_{lo}(t)=e^{j(\omega t+\theta(t))}, \qquad (\text{Eq. 1})$$

where t is time, ω is frequency in radians/sec, and θ(t) is the phase noise of the local oscillator signal. The data converter 105 can convert the down-converted signal from the first mixer 104 to a digital data signal. The second mixer 106 can apply a digital representation of the phase noise of the local oscillator signal to the digital data signal such that the phase noise introduced at the first mixer 104 is cancelled, equalized, or mitigated via the second mixer 106. The digital representation of the phase noise can be represented as, $$p(n)=e^{-j\theta(n)}. \qquad (\text{Eq. 2})$$

Thus, the output of the second mixer 106 is a compensated digital data signal with little or no phase noise of the local oscillator signal. In certain aspects, the output of the second signal can be passed to a baseband processor via a digital front-end (DFE) circuit. In certain aspects, the digital front-end can include the second mixer 106.

In certain aspects, the local oscillator generator 103 can include a DPLL and a component of the DPLL can provide estimate information to allow generation of the digital phase noise signal, (p(n)) applied at the second mixer 106. Thus, components of the DPLL or associated with the DPLL can measure or estimate the phase noise of the local oscillator generator 103 in the time domain and can provide a signal, based on the measured/estimated phase noise, that cancels the local oscillator 103 induced phase noise in a digital domain at the second mixer 106. In conventional analog PLLs, phase noise is not readily available. However, the inventors have recognized that phase noise information can be extracted from the output of the a DPLL by employing a time-to-digital converter (TDC).

Figure 2:
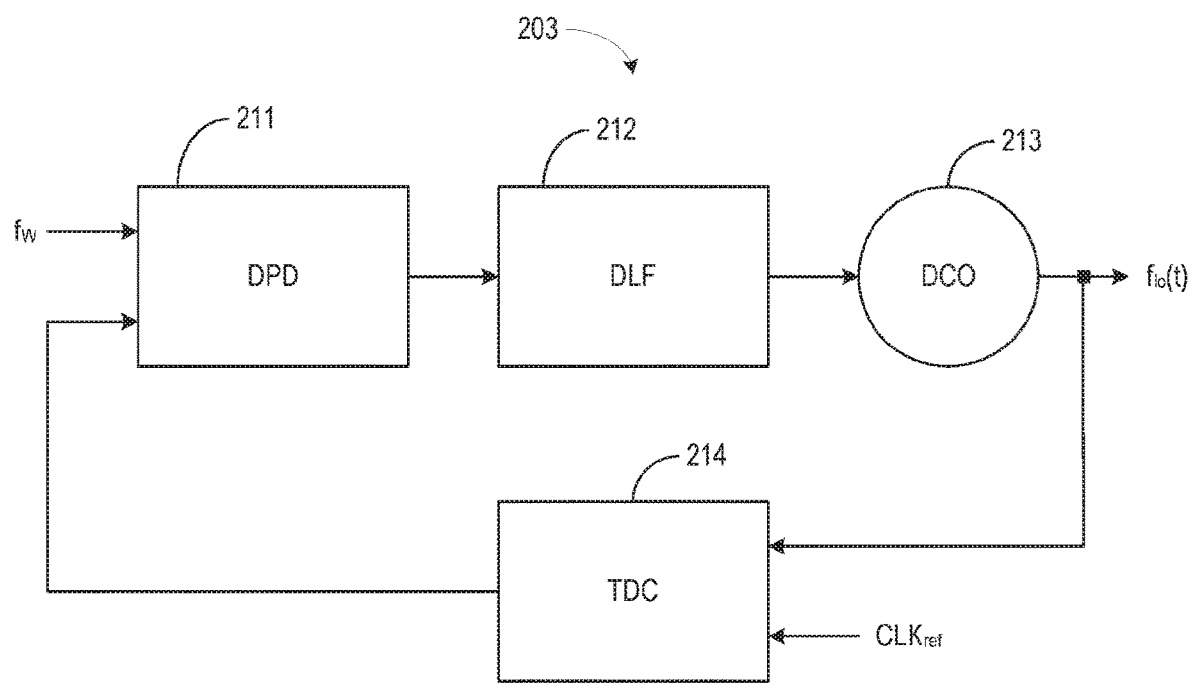
FIG. 2 illustrates an example ADPLL for generating a local oscillator (LO) signal according to certain aspects of the present subject matter.

FIG. 2 illustrates an example ADPLL 203 for generating a local oscillator (LO) signal according to certain aspects of the present subject matter. The ADPLL 203 can include digital phase detector (DPD) 211, a digital loop filter (DLF) 212, a digitally controlled oscillator (DCO) 213 and a feedback path including a TDC 214. The TDC 214 can compare the phase of a reference clock ($CLK_{ref}$) and the phase of the output of the DCO 213 and can generate a digital representation of fractional phase difference between the reference clock ($CLK_{ref}$) and the output of the DCO 213 feedback phase difference. Digital phase detector (DPD) 211 can subtract the feedback phase difference from a programmed fractional phase difference to generate an error signal. The DLF 212 can filter the output of the DPD 211 to provide information for controlling, for example, digital varactors (switch capacitors) of the DCO 213. Changes in the digital varactors can change the instantaneous frequency or phase of the DCO 213. The feedback loop of the ADPLL 203 operates to minimize the error signal such that the phase of the LO signal of the DCO 213 is locked to the phase of the reference clock ($CLK_{ref}$). Since the TDC 214 digitizes the phase, it can also provide information about phase noise of the ADPLL 203. By processing the output of the TDC 214, an estimate of the phase noise of the ADPLL 203 can be generated. Although the output of the TDC 214 can be processed to provide the phase noise information, the output of the DPD 211 can be more convenient. It is understood that the example of FIG. 2 is one example implementation of a DPLL, and that other implementations are possible without departing from the scope of the present subject matter.

Figure 3:
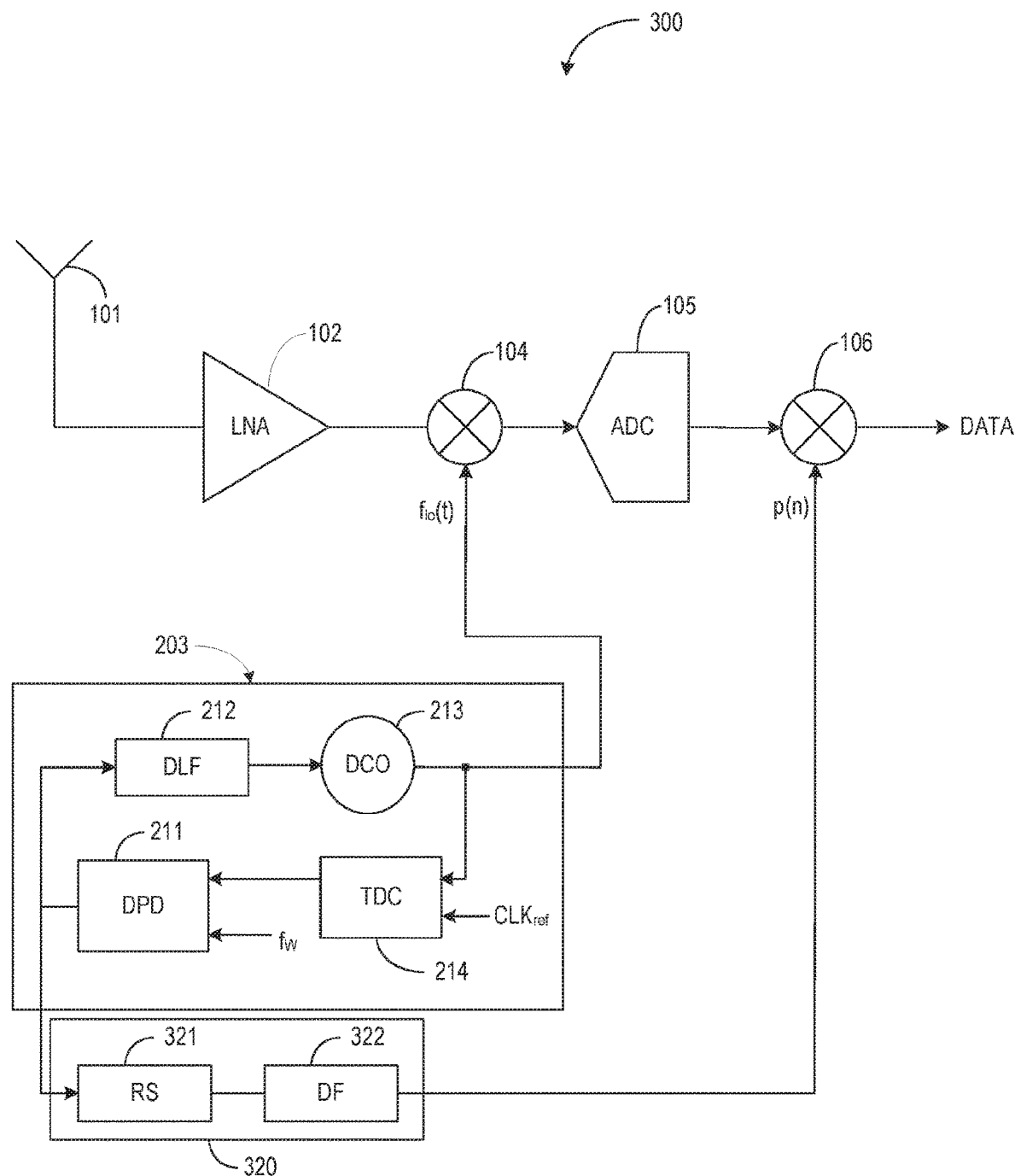
FIG. 3 illustrates generally a system with an example phase noise equalization architecture.

FIG. 3 illustrates generally a system 300 with an example phase noise equalization architecture. The system 300 can include an antenna 101, a low noise amplifier (LNA) 102, a local oscillator generator 203, a first mixer 104, a data converter 105, and a second mixer 106. The antenna 101 can receive wireless signals such as mmW signals. The LNA 102 can amplify the mmW signals. In certain aspects, the LNA 102 can filter the received mmW signals to reject certain frequency components and to amplify frequency components of interest. At the first mixer 304, the mmW signal can be down-converted using a local oscillator signal received from a local oscillator signal generator 203. The data converter 105 can convert the down-converted signal from the first mixer 104 to a digital data signal.

The second mixer 106 can apply a digital representation of the phase noise of the local oscillator signal to the digital data signal such that the phase noise introduced at the first mixer 104 is cancelled via the second mixer 106. Thus, the output of the second mixer 106 is a compensated digital data signal with little or no phase noise of the local oscillator signal.

The local oscillator signal generator 203 can include a digital PLL (DPLL) such as a ADPLL as discussed above with respect to FIG. 2. In certain aspects, the system 300 or optionally, the local oscillator signal generator 203, can include an equalization circuit 320 to provide a digital representation of phase noise generated within the local oscillator signal generator 203. The equalization circuit 320 can include a resample circuit 321 and a digital adaptive filter circuit 322. A phase noise feed forward path of the DPLL can tap the output of the DPD 311 of the DPLL. The output of the DPD 311 can include information that includes phase noise information. The resample circuit 321 can provide samples of the output of the DPD 211 at the same rate as that of data converter 105. The adaptive filter circuit 322 can ensure that the shape of the representation of the phase noise at the second mixer 106 matches the shape of the phase noise profile at the first mixer 104. In certain aspects, as an unexpected benefit, the adaptive filter circuit 322 can also track changes in phase noise due to process voltage and temperature (PVT) variations. In certain aspects, the example phase noise equalization architecture of the system 300 can be extended to transmitter processing paths or other transceiver architectures like dual conversion architectures, for example. In certain aspects, the example phase noise equalization architecture of the system 300 can be extended to equalize phase noise of an oscillator for a data converter (e.g., 105) in one or more paths of a receiver, a transmitter, or a transceiver. In certain aspects, the equalization circuit can include one or more delay elements to compensate for delays in the processing path between the first mixer 104 and the second mixer 106.

Figure 4:
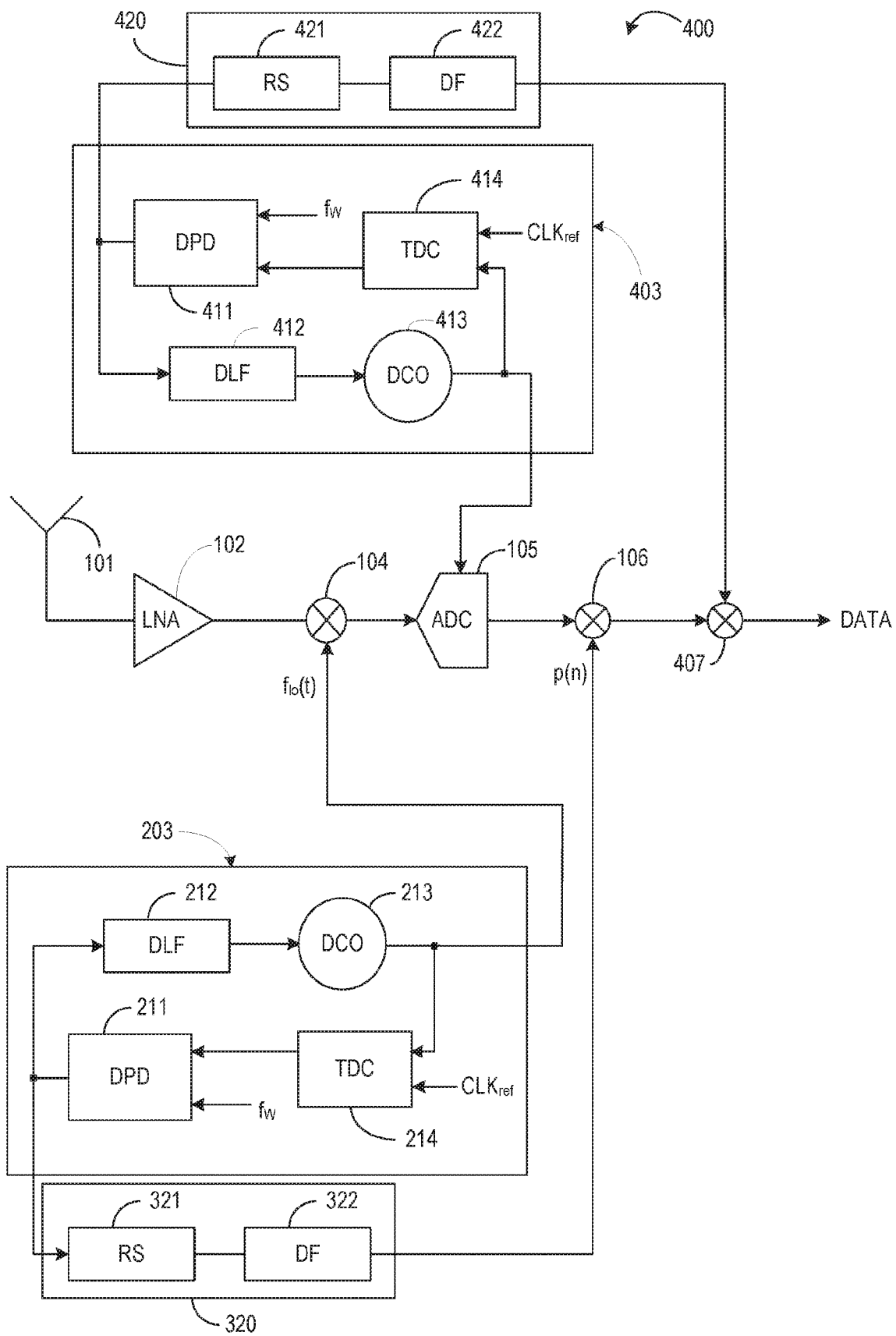
FIG. 4 illustrates generally an example system including phase noise equalization architecture extended to a data converter of a receiver.

FIG. 4 illustrates generally an example system 400 including phase noise equalization architecture extended to a data converter 105 of a receiver. In certain aspects the system 400 can include the example system of FIG. 3. In addition, that system 400 of FIG. 4 includes a converter oscillator signal generator 403 for generating a clock signal for the receiver data converter 105, and a converter equalization circuit 420. The converter oscillator signal generator 403 can include an ADPLL. The ADPLL can include a converter DLF 412, a converter DCO 413, a converter TDC 414, and a converter DPD 411. The converter TDC 414 can receive an output of the converter DCO 413 and a converter reference clock ($CCLK_{ref}$) and can provide an error signal indicative of a phase difference. The converter DPD 411 can receive the output of the converter TDC 414 and frequency command data (f) and can provide frequency command information for the converter DCO 413.

The converter DPD 411 can also provide phase noise information about the phase noise introduced by the local oscillator generator 403 of the converter 105. The converter equalization circuit 420 can provide a digital representation of the converter phase noise and a third mixer 407 of the system 400 can digitally equalize, or digitally subtract, the phase noise introduced at the converter 105.

Figure 5:
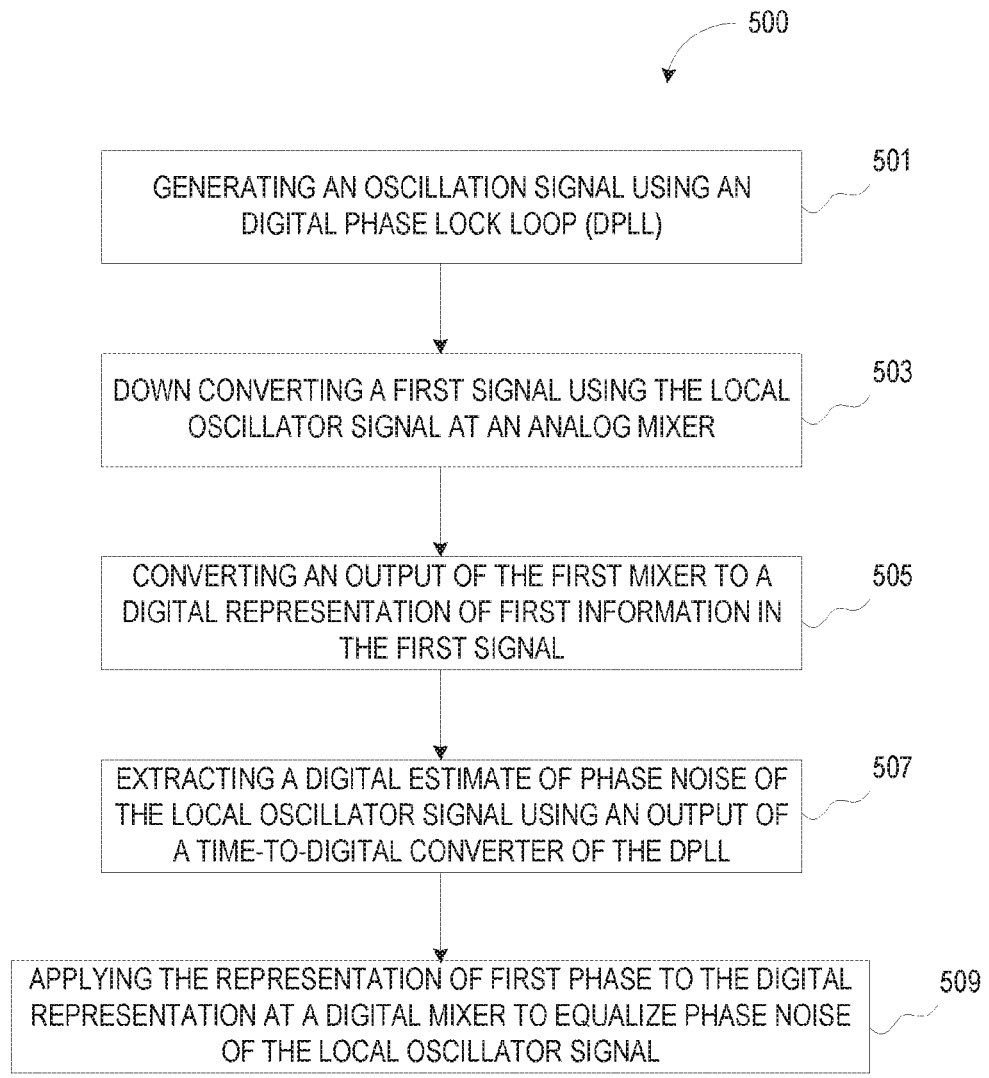
FIG. 5 illustrates generally a flowchart of an example method of phase noise equalization of a DPLL according to various aspects of the present subject matter.

FIG. 5 illustrates generally a flowchart of an example method 500 of phase noise equalization of a DPLL according to various aspects of the present subject matter. The method of phase noise equalization illustrated in FIG. 5 is couch in a receiver application, however, the present subject matter is not so limited and can be applied to other application using a DPLL. At 501, an oscillator signal can be generated using a DPLL. At 503, the oscillator signal can be used with a mixer to down-convert a signal, such as a signal received at a receiver or transceiver. At 505, the output of the first mixer can be received at an analog-to-digital converter and can be converted to a digital signal. The digital signal can include information or a representation of information modulated within the received signal. At 507, a TDC of the DPLL can extract and provide a digital estimate of phase noise introduced by the DPLL in the oscillator signal. At 509, the digital estimate can be applied to the output of the ADC using a second, digital mixer. In certain aspects, the output of the TDC can be re-sampled and digitally filter so that the sampling frequency of the phase noise corresponds to a frequency of the ADC, and that the shape of the phase noise in the digital domain at the second mixer corresponds to the shape of the phase noise introduced at the first mixer.

Figure 6:
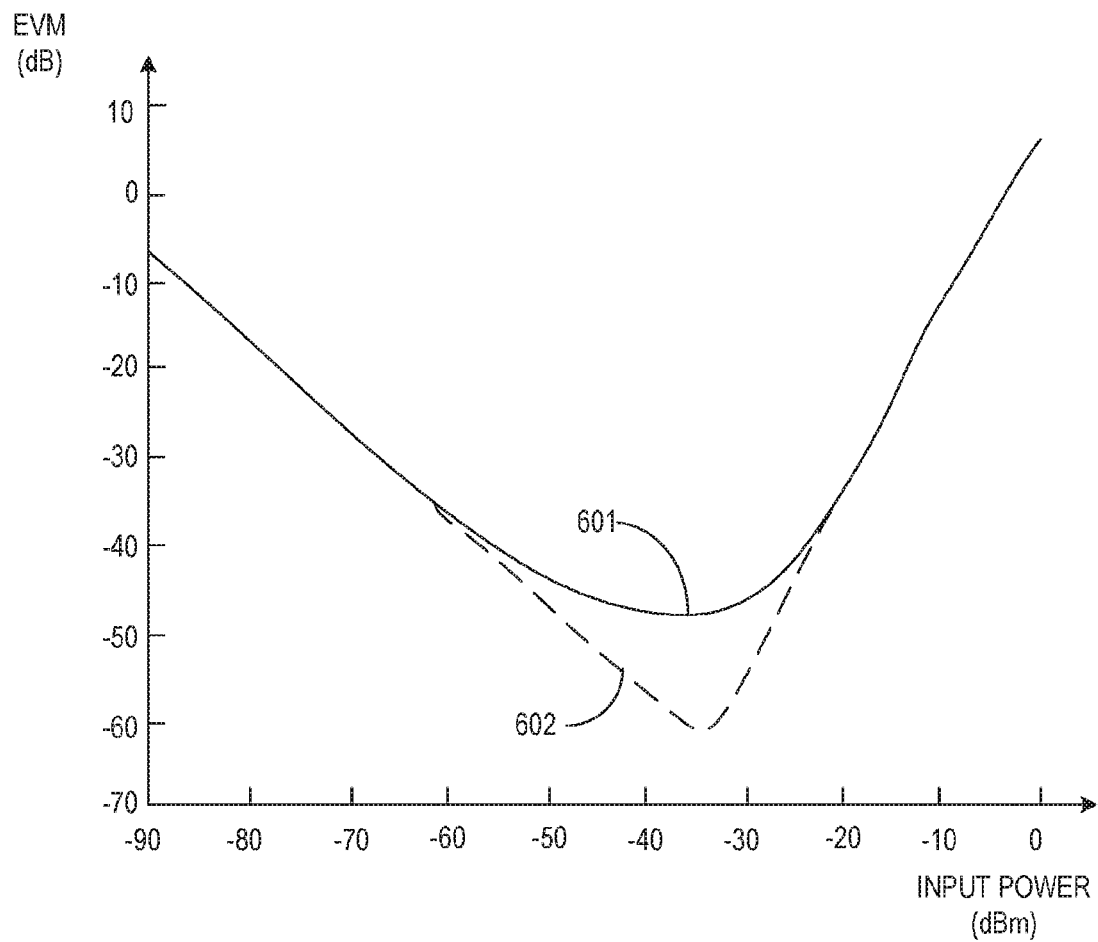
FIG. 6 illustrates graphically performance of noise equalization according to various aspects of the present subject matter.

FIG. 6 illustrates graphically performance of noise equalization according to various aspects of the present subject matter. A first plot 601 illustrates the EVM versus input power without equalization and a second plot 602 shows EVM versus input power with phase noise equalization. With equalization, the EVM at about 40 dBm input power improves from about −47 dB to about −61 dB.

In some applications, for example, in 5G New Radio (NR), where modulation orders are higher (256 QAM and proposed to go to 1024 QAM) for enabling higher throughput, phase noise requirements can be much more stringent in order to meet more aggressive EVM targets. Present solutions converge on using higher performance PLLs that consume more power than PLLs used for lower modulation orders. The present inventors have recognized, that the higher order modulation capabilities are not continuously utilized and often represent a small percentage of time that the UE is in connected mode, therefore, if the high order modulation capabilities of the high performance PLL can be enabled and disabled, the charge or battery life of the UE can be maximized while also providing the high order modulation when needed. In certain aspects, a processor or logic circuit can decode control channel information for the modulation order of upcoming data symbols and can enable and disable high order modulation capabilities of the PLL as needed. In some aspects, when, for example, decoding delays may not be able to enable or disable immediately following symbols (e.g., short symbol times of 5G), the present subject matter provides an algorithm that anticipates when higher PLL performance is used.

Figure 7:
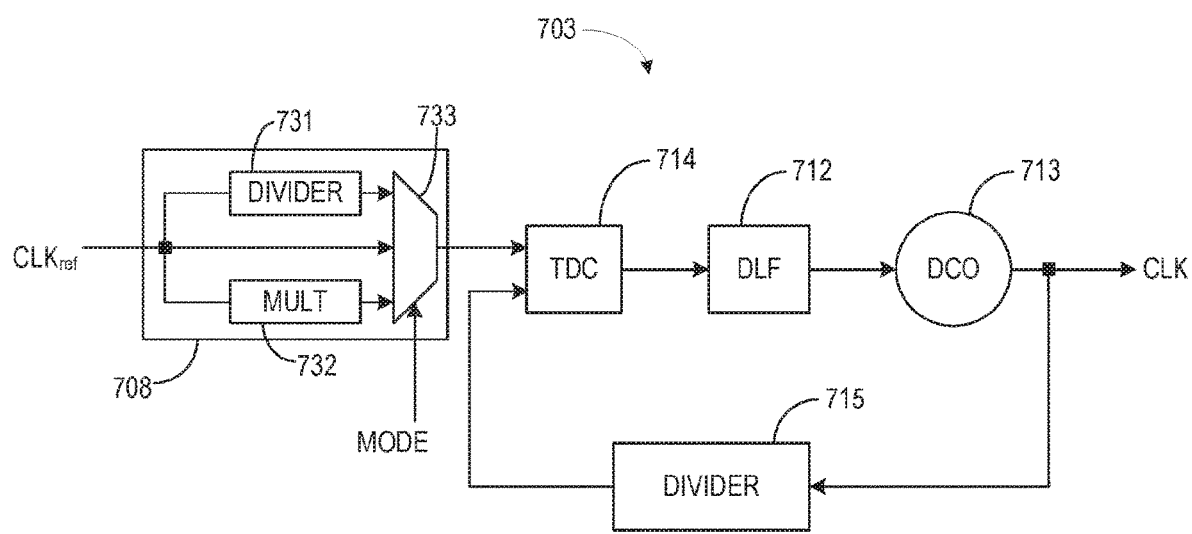
FIG. 7 illustrates generally an example multiple-mode phase lock loop (MMPLL) for providing a clock signal (CLK), such as a clock signal for modulating or demodulating a transmission signal, such as a wireless transmission signal.

FIG. 7 illustrates generally an example multiple-mode phase lock loop (MMPLL) 703 for providing a clock signal (CLK), such as a clock signal for modulating or demodulating a transmission signal, such as a wireless transmission signal. The MMPLL 703 can include a digital PLL (DPLL), such as an all-digital PLL (ADPLL), with a reference clock selection circuit 708. The MMPLL 703 can include a time-to-digital converter (TDC) 714, a digital loop filter (DLF) 712, a digitally controlled oscillator (DCO) 713, and a digital divider 715 in a feedback path. In general, DPLLs can provide better phase noise characteristics and are more compact in size than their analog counterparts. DPLLs can provide flexibility in optimizing loop bandwidth by changing coefficients of the DLF 712. A TDC 714 typically replaces the phase frequency detector (PFD) of conventional charge pump PLLs. The TDC 714 can compare the phase of a reference clock and a phase of an output, possibly divided, of the DCO 713 and can provide a digital representation of the clock signal of the DPLL as well as an estimate of phase noise within the DPLL clock signal. The DLF 712 can filter the output of the TDC 714 thereby producing an output to control digital varactors (switch capacitors) that determine the frequency of the output of the DCO 713. Contributions of output phase noise of a ADPLL can be received from the reference clock, TDC 714, and DCO 713. Phase noise from the reference clock and TDC 714 see a low pass filter response while DCO 713 phase noise sees a high pass filtering. Phase noise (p) contribution from TDC 714 is given by, $$p(f) = \frac{2\pi \cdot tdc_{unit_{delay}} \cdot f_{dco}/N}{f_{ref}}, \qquad \text{Eq. 3}$$

where $tdc_{unit_{delay}}$ is the delay of an individual delay cell which makes up the TDC delay cells, $f_{dco}/N$ is the DCO frequency divided by the divider ratio, and $f_{ref}$ is the frequency of the reference clock. Thus, phase noise contribution from the TDC 714 can be reduced by increasing the reference frequency. Reducing phase noise of the TDC 714 can reduce the in-band phase noise of the MMPLL, thus, reducing integrated phase noise (IPN).

Referring again to FIG. 7, at the input of the MMPLL 703, the selection circuit 708 can include one or more options for either increasing or decreasing a frequency of the reference clock input to the TDC 714. In some examples, the selection circuit 708 of the MMPLL 703 can include a digital divider 731, a digital multiplier 732 and a multiplexer 733 or switch. In high performance operation, when higher orders of modulation are needed, the reference clock signal ($CLK_{ref}$) can be multiplied or passed directly to the TDC 714. When the high-performance capabilities of the MMPLL 703 are not needed, the reference clock ($CLK_{ref}$) can be divided down via a control signal (MODE) from the baseband processor or a transceiver circuit. Operating the TDC 714 at a lower reference frequency can reduce the power consumption at the expense of increased phase noise. In contrast, operating the TDC 714 at a higher reference frequency can improve the phase noise performance of the MMPLL 703 at the expense of increased power consumption. The DLF 712 can be clocked at the same reference frequency as the TDC 714. If the coefficients of the DLF 712 are held constant, then bandwidth of the DLF 712 can be scaled with the reference clock frequency received at the TDC 714. It is understood that the example of FIG. 7 is one specific implementation of an example MMPLL, and that other implementations are possible without departing from the scope of the present subject matter.

Figure 8:
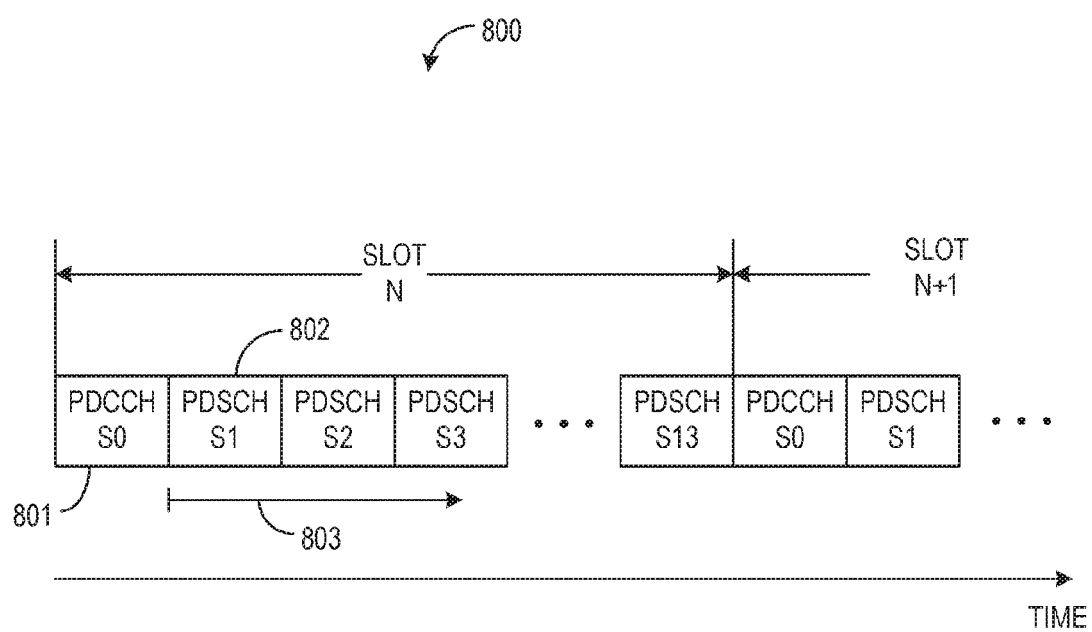
FIG. 8 illustrates a control channel information decoding delay problem using a frame of data.

FIG. 8 illustrates a control channel information decoding delay opportunity using a frame of data 800. When the control channel, such as the Physical Downlink Control Channel (PDCCH) of LTE/5G, symbol S0 801 indicates that the immediately following data symbols (S1-S3, 802) are high order modulation coding scheme (MCS), a high-performance/high-power mode of an MMPLL (e.g., FIG. 6, 603) can be used, and when the immediately following data symbols (S1-S3, 802) are lower order MCS, a lower-power/moderate-performance mode of the MMPLL can be used. However, there can be a delay 803 associated with decoding the first control channel symbol (S0) 801. It is recognized that it may not be possible to decode and implement the proper mode of the MMPLL before receiving the symbols 802 immediately following the first control channel symbol (S0) 801. If the MMPLL defaulted to always processing the symbols immediately following the first control channel symbol (S0) 801 using high performance, it may not be possible to reliably reconfigure the MMPLL for lower-power/moderate-performance in the middle of a symbol sequence, as this can open the opportunity for a phase discontinuity and the improper decode of some symbols, as well as, channel estimation can be degraded. In such scenarios, the MMPLL may run in the high-performance mode a majority of the time even if a majority of the symbols can tolerate a lower order of modulation.

To solve the problem illustrated in FIG. 8, the inventors have recognized that the UE can use the UE's own metrics to determine a likely modulation assignment and configure the MMPLL in the predicted mode of operation accordingly. Such metrics can include, but are not limited to, various reference signal measurements, various resource management measurements, standard LTE/5G parameters derived by the UE itself. (e.g., reference signal received power (RSRP), reference signal received quality (RSRQ), channel quality indicator (CQI)), the MCS assignment for the previous slot $MCS_{n-1}$ (assuming there was PDSCH data for that UE), or combinations thereof.

As CQI feedback to the eNB can be a large part what determines a UE's upcoming MCS assignment, the inventors have recognized an algorithm that allows the UE to anticipate the range of MCS values to be assigned. Even in the worst case, if the UE uses a mismatched MMPLL configuration, then either (1) the UE used the higher performance PLL mode when it didn't need to, and thus wasted some power, or (2) the UE used the lower performance PLL mode and encountered some symbol or data block errors, which can be mitigated via modem error correction or HARQ retries. In the latter case, the UE can reconfigure the MMPLL for the higher performance mode at the earliest possible opportunity. In certain aspects, the UE, while in an idle connection state such as decoding paging data (e.g., PDCCH only), can use the lower performance mode of the MMPLL since the PDCCH is sent using constant QPSK modulation.

Figure 9:
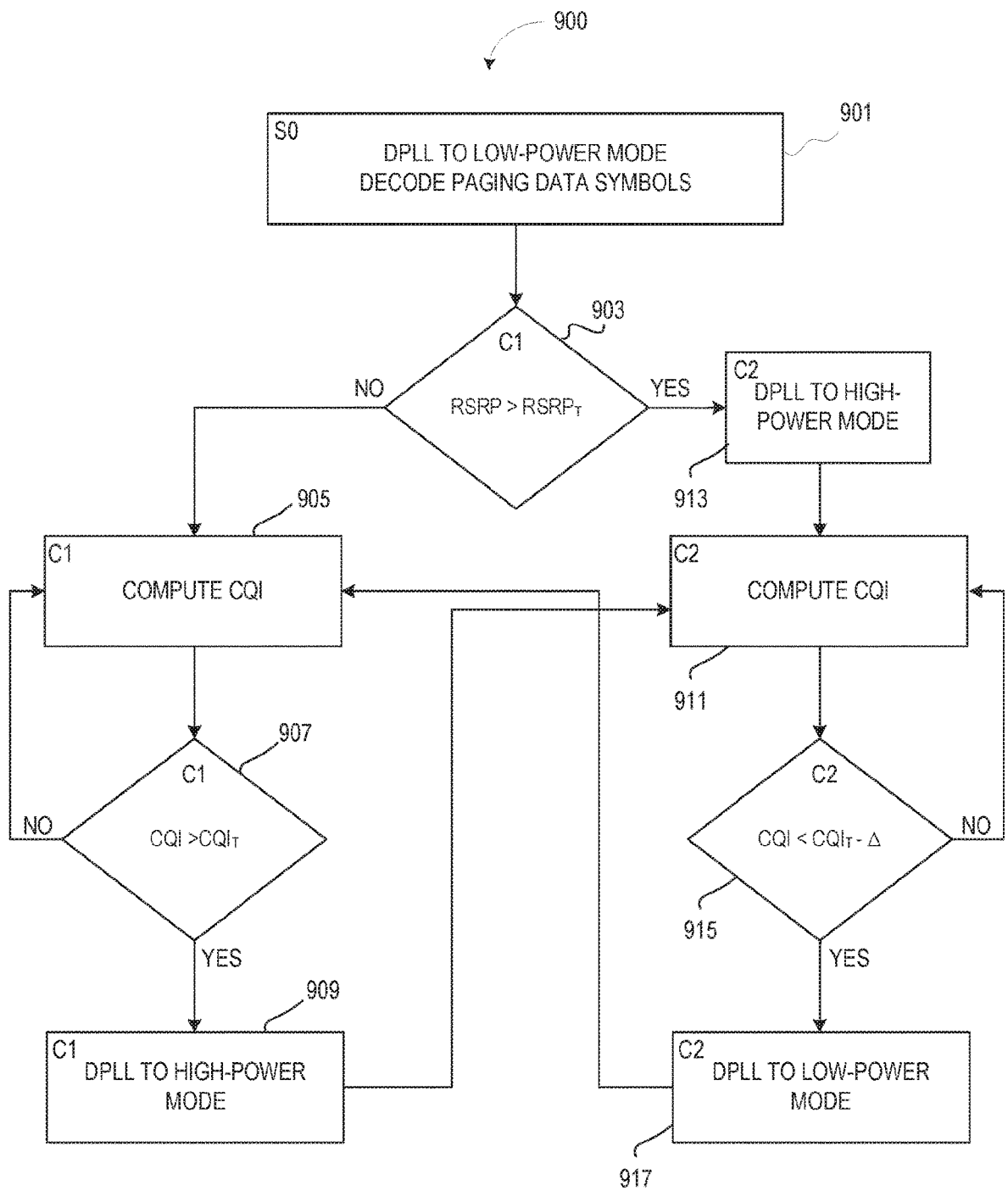
FIG. 9 illustrates generally a flow chart or state diagram of an example algorithm of anticipating MMPLL performance requirements.

FIG. 9 illustrates generally a flow chart or state diagram of an example algorithm 900 of anticipating MMPLL performance requirements. At 901, while the UE is in a first state or an idle state (S0), the UE may be receiving paging data from the network at an interval defined by the network. The idle state (S0) can have the UE decoding PDCCH symbols, reference symbols, or frequency synchronization symbols, which do not employ high order modulation and so the MMPLL can be set to a first, low power/moderate performance mode. During the idle state (S0), the UE can be computing RSRP and/or RSRQ. When the UE receives a page indicating that network-initiated data is pending, the UE can connect to the network using a random access channel (RACH), perform time synchronization, and then start listening to the receiver slots upon actual data grant from the network. As soon as the UE starts decoding the first slot for which user data is expected, the UE transitions from state S0 to a connected state. At 903, the UE can compare RSRP to an RSRP threshold ($RSRP_T$). The RSRP threshold represents a value of the RSRP below which only low order MCS assignments are expected. To be conservative, the RSRP threshold can be set lower than a theoretical calculated value based on historical measurements.

Once in a first connected mode state C1, at 903, and the RSRP is less than the threshold RSRP, the UE or a modem of the UE can continually compute CQI and send its value back to the eNB over an uplink control channel such as the physical uplink control channel (PUCCH) of LTE/5G. In certain aspects, the UE can report the highest CQI index corresponding to the MCS and transport block size (TBS) for which the estimated down link (DL) transport block error rate (BLER) does not exceed 10% or other predetermined threshold. Therefore, at 907, if the CQI increases above a threshold $CQI_T$ where it is possible for the eNB to assign a higher order modulation such as 256 QAM, the UE, at 909, can reprogram the MMPLL for a higher performance (e.g., lower phase noise) mode. In certain examples, the reprogramming can be executed during the transmitter guard time period or whenever there is a gap in the receiver PDSCH stream for that UE. At 911, after the MMPLL is placed in the high-performance mode and a second connected mode state C2, for example, after the CQI increases above the threshold (CQIT) while in the first connected mode state C1, or upon entering the first connected mode C1, the RSRP is greater than the threshold RSRP and the MMPLL is placed in the high-performance mode at 913, the UE or a modem of the UE can continually compute CQI and send its value back to the eNB over the PUCCH. In some aspects, at 915, if the MMPLL is in a high performance mode, and the CQI falls below another preset threshold $CQI_T$–Δ, then the UE, at 917, can anticipate that a lower order MCS will be assigned and can reconfigure the MMPLL to a lower performance mode to conserve power. In certain aspects, the hysteresis parameter (Δ) can allow for a conservative decision to go back to low power PLL mode, to minimize the occurrence of HARQ retries due to use of the low power PLL mode. It is expected that the hysteresis parameter (Δ) is typically set to a value of one or two, in CQI units, but is not so limited.

In certain examples, the UE can learn what values of $CQI_T$ and Δ result in a good balance of minimal HARQ retries (due to use of lower performance PLL mode at too high a CQI level) and low power consumption (i.e., avoiding operation in high performance PLL mode when not needed). In certain aspects, a UE can include a decision tree or lookup table to assist in setting a performance mode of the MMPLL. In some aspects, the decision tree can be keyed by a location, network operator, time of day, or one or more of the UE or network measurements. In some aspects, the UE can periodically monitor success or failure of a particular MCS assignment and can modify the decision tree or lookup table accordingly. For example, in certain aspects, the UE can include a lookup table for each known network operator and upon attaching to a network, determine the operator and control the MMPLL based on the historically processed data associated with that network carrier. In certain situation, it may be known that a certain network operator does not use higher modulation orders and, when the UE is operating under a network of that network operator, the UE can keep the MMPLL in a lower performance/lower power mode at all times, thus, significantly improving the charge or battery life of the UE. Pseudo code for such an aspect may include:

ATTACH to a network
DECODE the public land mobile network (PLMN) of the network;
PERFORM PLMN look-up from a database to determine maximum MCS for network operator
IF maximum MCS corresponds to a first threshold, for example 64 QAM or less, THEN.
   SET MMPLL to low performance mode
END IF.

It is understood that although the example of FIG. 9 is presented in terms of LTE/5G, the method can be applied to other communication protocols and other communication medium without departing from the scope of the present subject matter.

Figure 10:
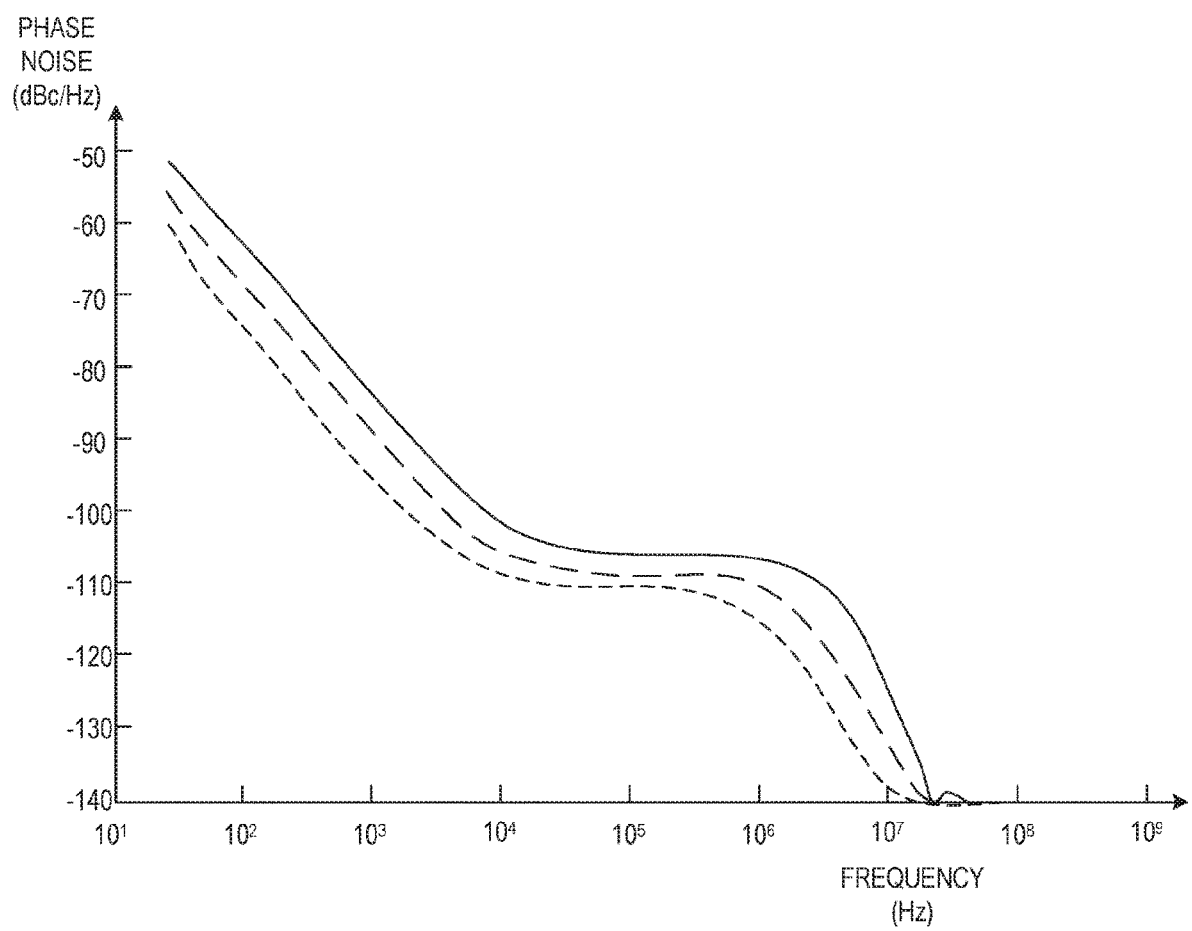
FIG. 10 illustrates graphically simulation of total PLL phase noise for three different clock rates supplied to a TDC of an example PLL.

FIG. 10 illustrates graphically simulation of total PLL phase noise for three different clock rates supplied to a TDC of an example PLL. Total integrated phase noise thus can be varied from −40.9 to −44 dBc depending on the selected mode. ADPLLs can have large digital portions that when run at reduced clock speed can use less power. Lab measurements have shown that current 5G ADPLL implementations can save up to 9 mW of power when configured as MMPLLs.

Figure 11:
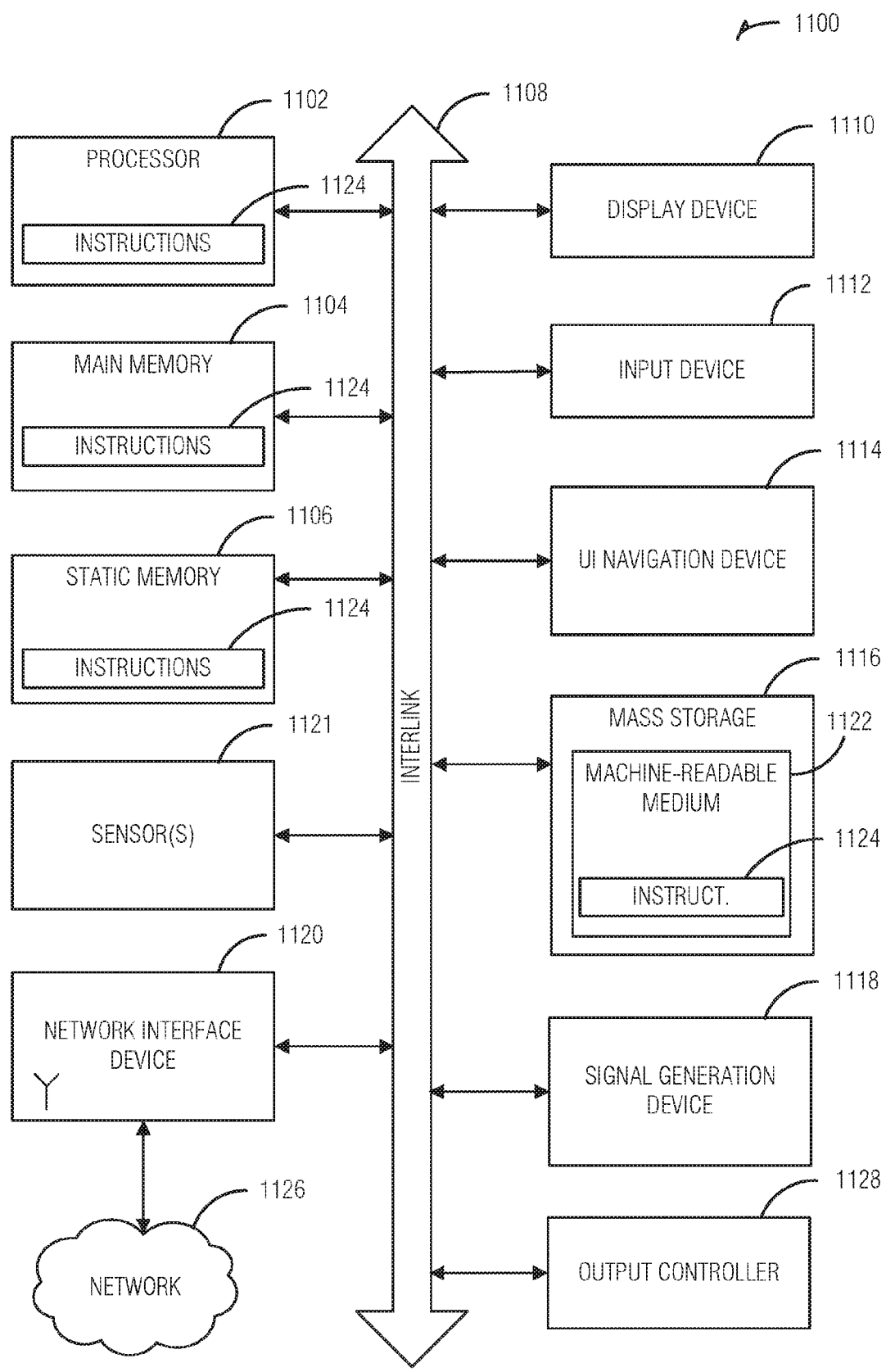
FIG. 11 illustrates a block diagram of an example machine upon which any one or more of the techniques (e.g., methodologies) discussed herein may perform.

FIG. 11 illustrates a block diagram of an example machine 1100 upon which any one or more of the techniques (e.g., methodologies) discussed herein may perform. In alternative embodiments, the machine 1100 may operate as a standalone device or may be connected (e.g., networked) to other machines. In a networked deployment, the machine 1100 may operate in the capacity of a server machine, a client machine, or both in server-client network environments. In an aspect, the machine 1100 may act as a peer machine in peer-to-peer (or other distributed) network environment. As used herein, peer-to-peer refers to a data link directly between two devices (e.g., it is not a hub and spoke topology). Accordingly, peer-to-peer networking is networking to a set of machines using peer-to-peer data links. The machine 1100 may be a single-board computer, an integrated circuit package, a system-on-a-chip (SOC), a personal computer (PC), a tablet PC, a set-top box (STB), a personal digital assistant (PDA), a mobile telephone, a web appliance, a network router, or other machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Aspects, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an aspect, hardware of the circuitry may be immutably designed to carry out a specific operation (e.g., hardwired). In an aspect, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for aspect, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an aspect, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 1100 may include a hardware processor 1102 (e.g., a central processing unit (CPU), a graphics processing unit (GPU), a hardware processor core, or any combination thereof), a main memory 1104 and a static memory 1106, some or all of which may communicate with each other via an interlink (e.g., bus) 1108, the machine 1100 may further include a display unit 1110, an alphanumeric input device 1112 (e.g., a keyboard), and a user interface (UI) navigation device 1114 (e.g., a mouse). In an aspect, the display unit 1110, input device 1112 and UI navigation device 1114 may be a touch screen display. The machine 1100 may additionally include a storage device (e.g., drive unit) 1116, a signal generation device 1118 (e.g., a speaker), a network interface device 1120, and one or more sensors 1121, such as a global positioning system (GPS) sensor, compass, accelerometer, or other sensor. The machine 1100 may include an output controller 1128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In certain aspects, any one or more of the display unit 1110, storage device 1116, network interface device or combination thereof can include a multiple device PCIe card as discussed above.

The storage device 1116 may include a machine readable medium 1122 on which is stored one or more sets of data structures or instructions 1124 (e.g., software) embodying or utilized by any one or more of the techniques or functions described herein. The instructions 1124 may also reside, completely or at least partially, within the main memory 1104, within static memory 1106, or within the hardware processor 1102 during execution thereof by the machine 1100. In an aspect, one or any combination of the hardware processor 1102, the main memory 1104, the static memory 1106, or the storage device 1116 may constitute machine readable media.

While the machine readable medium 1122 is illustrated as a single medium, the term "machine readable medium" may include a single medium or multiple media (e.g., a centralized or distributed database, and/or associated caches and servers) configured to store the one or more instructions 1124.

The term "machine readable medium" may include any medium that is capable of storing, encoding, or carrying instructions for execution by the machine 1100 and that cause the machine 1100 to perform any one or more of the techniques of the present disclosure, or that is capable of storing, encoding or carrying data structures used by or associated with such instructions. Non-limiting machine readable medium examples may include solid-state memories, and optical and magnetic media. In an aspect, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1124 may further be transmitted or received over a communications network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an aspect, the network interface device 1120 may include one or more physical jacks (e.g., Ethernet, coaxial, or phone jacks) or one or more antennas to connect to the communications network 1126. In an aspect, the network interface device 1120 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1100, and includes digital or analog communications signals or other intangible medium to facilitate communication of such software.

Figure 12:
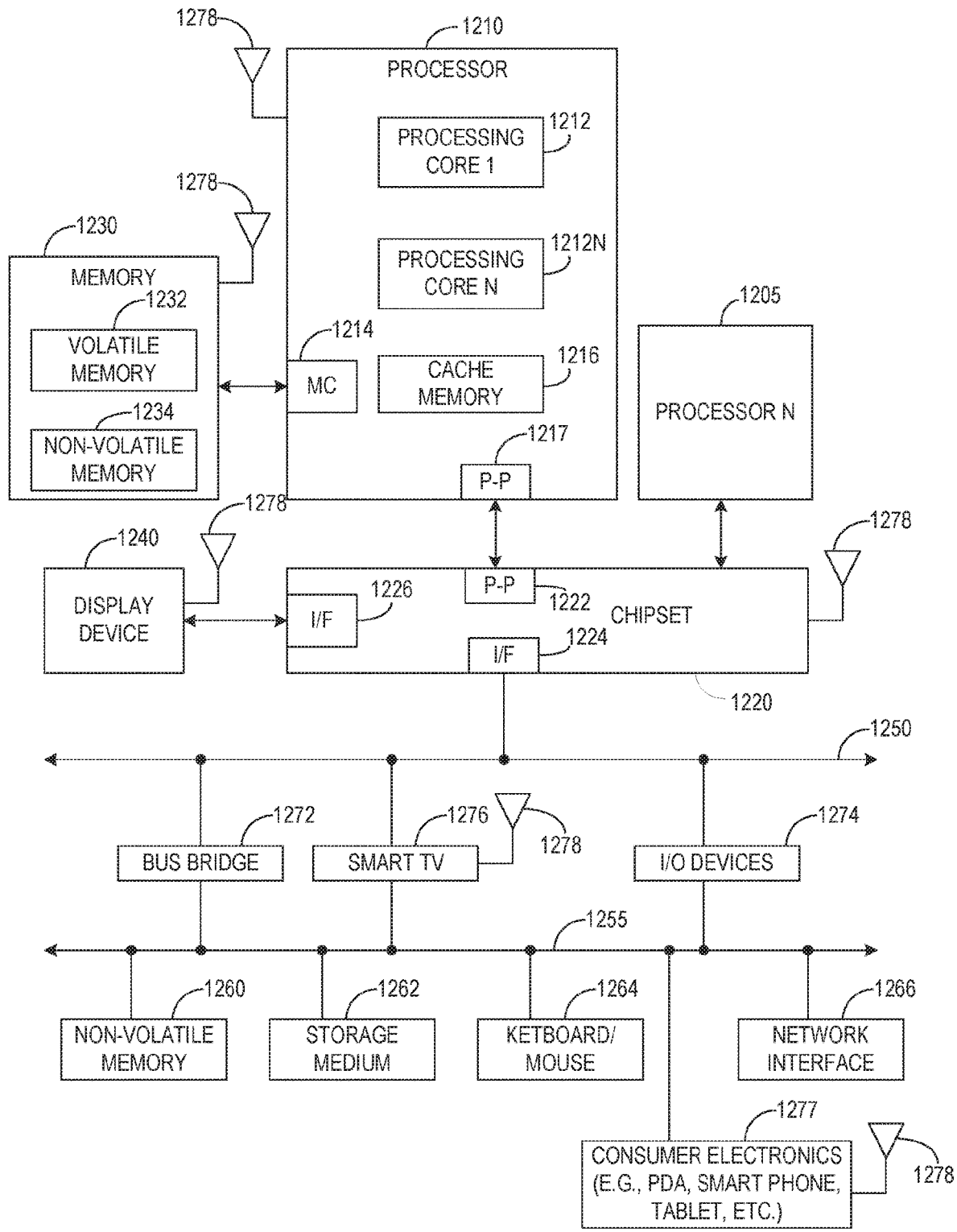
FIG. 12 illustrates a system level diagram, depicting an aspect of an electronic device (e.g., system) including a local oscillator as described in the present disclosure.

FIG. 12 illustrates a system level diagram, depicting an aspect of an electronic device (e.g., system) including a local oscillator as described in the present disclosure. In one aspect, system 1200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some aspects, system 1200 is a system on a chip (SOC) system.

In one aspect, processor 1210 has one or more processor cores 1212 and 1212N, where 1212N represents the Nth processor core inside processor 1210 where N is a positive integer. In one aspect, system 1200 includes multiple processors including 1210 and 1205, where processor 1205 has logic similar or identical to the logic of processor 1210. In some aspects, processing core 1212 includes, but is not limited to, pre-fetch logic to fetch instructions, decode logic to decode the instructions, execution logic to execute instructions and the like. In some aspects, processor 1210 has a cache memory 1216 to cache instructions and/or data for system 1200. Cache memory 1216 may be organized into a hierarchal structure including one or more levels of cache memory.

In some aspects, processor 1210 includes a memory controller 1214, which is operable to perform functions that enable the processor 1210 to access and communicate with memory 1230 that includes a volatile memory 1232 and/or a non-volatile memory 1234. In some aspects, processor 1210 is coupled with memory 1230 and chipset 1220. Processor 1210 may also be coupled to a wireless antenna 1278 to communicate with any device configured to transmit and/or receive wireless signals. In one aspect, an interface for wireless antenna 1278 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1234 includes, but is not limited to, flash memory, phase change memory (PCM), read-only memory (ROM), electrically erasable programmable read-only memory (EEPROM), or any other type of non-volatile memory device.

Memory 1230 stores information and instructions to be executed by processor 1210. In one aspect, memory 1230 may also store temporary variables or other intermediate information while processor 1210 is executing instructions. In the illustrated aspect, chipset 1220 connects with processor 1210 via Point-to-Point (PtP or P-P) interfaces 1217 and 1222. Chipset 1220 enables processor 1210 to connect to other elements in system 1200. In some aspects of the example system, interfaces 1217 and 1222 operate in accordance with a PtP communication protocol such as the Intel® QuickPath Interconnect (QPI) or the like. In other aspects, a different interconnect may be used.

In some aspects, chipset 1220 is operable to communicate with processor 1210, 1205N, display device 1240, and other devices, including a bus bridge 1272, a smart TV 1276, I/O devices 1274, nonvolatile memory 1260, a storage medium (such as one or more mass storage devices) 1262, a keyboard/mouse 1264, a network interface 1266, and various forms of consumer electronics 1277 (such as a PDA, smart phone, tablet etc.), etc. In one aspect, chipset 1220 couples with these devices through an interface 1224. Chipset 1220 may also be coupled to a wireless antenna 1278 to communicate with any device configured to transmit and/or receive wireless signals.

Chipset 1220 connects to display device 1240 via interface 1226. Display 1240 may be, for example, a liquid crystal display (LCD), a plasma display, cathode ray tube (CRT) display, or any other form of visual display device. In some aspects of the example system, processor 1210 and chipset 1220 are merged into a single SOC. In addition, chipset 1220 connects to one or more buses 1250 and 1255 that interconnect various system elements, such as I/O devices 1274, nonvolatile memory 1260, storage medium 1262, a keyboard/mouse 1264, and network interface 1266. Buses 1250 and 1255 may be interconnected together via a bus bridge 1272.

In one aspect, mass storage device 1262 includes, but is not limited to, a solid state drive, a hard disk drive, a universal serial bus flash memory drive, or any other form of computer data storage medium. In one aspect, network interface 1266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family. Home Plug AV (HPAV), Ultra Wide Band (UWB), Bluetooth, WiMax, or any form of wireless communication protocol.

While the modules shown in FIG. 12 are depicted as separate blocks within the system 1200, the functions performed by some of these blocks may be integrated within a single semiconductor circuit or may be implemented using two or more separate integrated circuits. For example, although cache memory 1216 is depicted as a separate block within processor 1210, cache memory 1216 (or selected aspects of 1216) can be incorporated into processor core 1212.

Figure 13:
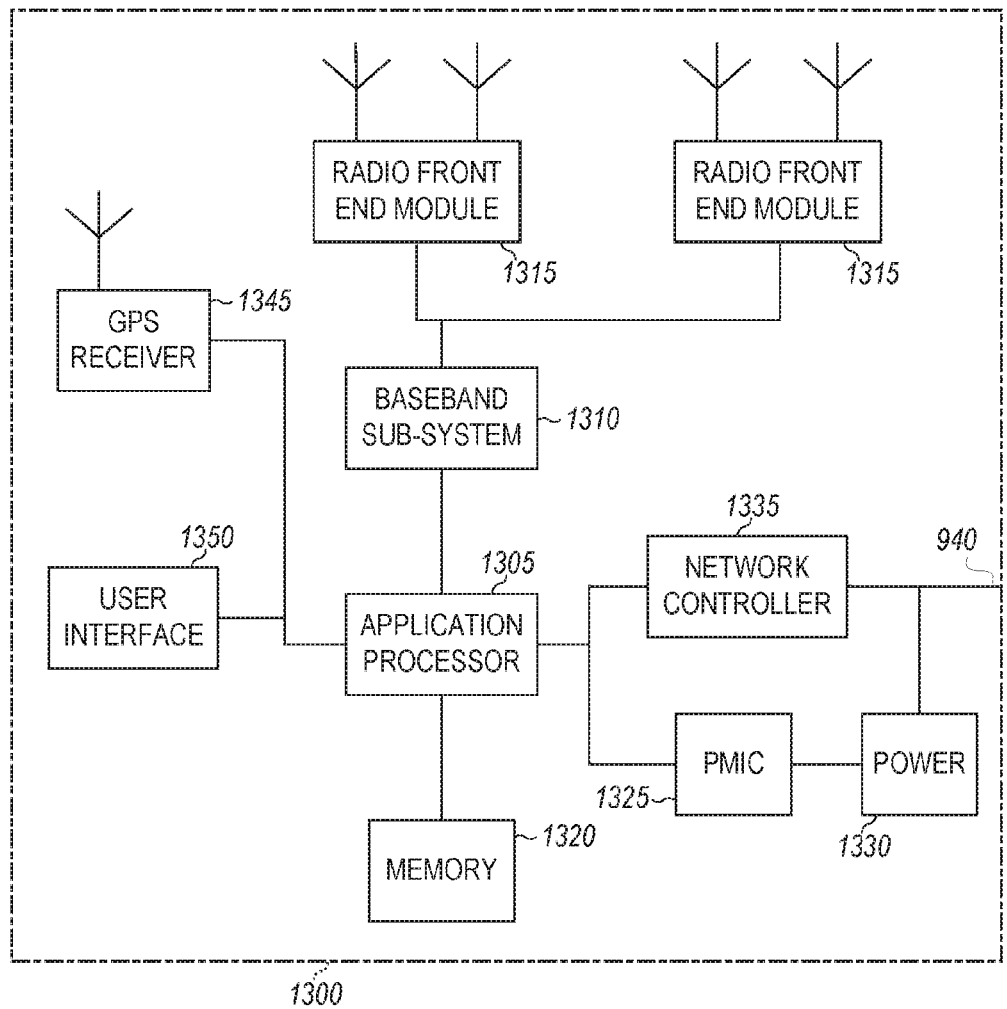
FIG. 13 illustrates an exemplary base station or infrastructure equipment radio head according to some aspects.

FIG. 13 illustrates an exemplary base station or infrastructure equipment radio head according to some aspects. The base station radio head 1300 may include one or more of application processor 1305, baseband processors 1310, one or more radio front end modules 1315, memory 1320, power management integrated circuitry (PMIC) 1325, power tee circuitry 1330, network controller 1335, network interface connector 1340, satellite navigation receiver (e.g., GPS receiver) 1345, and user interface 1350.

In some aspects, application processor 1305 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose 10, memory card controllers such as SD/MMC or similar, USB interfaces, MIPI interfaces and Joint Test Access Group (JTAG) test access ports.

In some aspects, baseband processor 1310 may be implemented, for example, as a solder-down substrate including one or more integrated circuits, a single packaged integrated circuit soldered to a main circuit board or a multi-chip sub-system including two or more integrated circuits.

In some aspects, memory 1320 may include one or more of volatile memory including dynamic random access memory (DRAM) and/or synchronous DRAM (SDRAM), and nonvolatile memory (NVM) including high-speed electrically erasable memory (commonly referred to as Flash memory), phase-change random access memory (PRAM), magnetoresistive random access memory (MRAM), and/or a three-dimensional crosspoint memory. Memory 1320 may be implemented as one or more of solder down packaged integrated circuits, socketed memory modules and plug-in memory cards.

In some aspects, power management integrated circuitry 1325 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1330 may provide for electrical power drawn from a network cable. Power tee circuitry 1330 may provide both power supply and data connectivity to the base station radio head 1300 using a single cable.

In some aspects, network controller 1335 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 1345 may include circuitry to receive and decode signals transmitted by one or more navigation satellite constellations such as the global positioning system (GPS). Globalnaya Navigatsionnaya Sputnikovaya Sistema (GLONASS), Galileo and/or BeiDou. The receiver 1345 may provide, to application processor 1305, data which may include one or more of position data or time data. Time data may be used by application processor 1305 to synchronize operations with other radio base stations or infrastructure equipment.

In some aspects, user interface 1350 may include one or more of buttons. The buttons may include a reset button. User interface 1350 may also include one or more indicators such as LEDs and a display screen.

ADDITIONAL NOTES

In a first example, Example 1, a circuit for cancelling phase noise can include a first mixer configured to receive a modulated signal, a digital phase-lock loop (DPLL) configured to provide a first clock signal to the first mixer and to provide a phase noise estimate of phase noise of the DPLL, an analog-to-digital converter (ADC) configured to receive an output of the analog mixer and provide digital information of the modulated signal, and an equalization circuit configured to receive the phase noise estimate from the DPLL and to apply a digital representation of the phase noise of the DPLL to the digital information via a second mixer to reduce phase noise of digital information.

In Example 2, the equalization circuit of Example 1 optionally includes a resample circuit configured to sample the phase noise estimate from a TDC of the DPLL at a rate corresponding to a rate of the ADC.

In Example 3, the equalization circuit of any one or more of Examples 1-2 optionally includes a resample circuit configured to sample the phase noise estimate from a digital phase detector of the DPLL at a rate corresponding to a rate of the ADC.

In Example 4, the DPLL of any one or more of Examples 1-3 optionally includes a digitally controlled oscillator configured to provide the first clock signal, the time-to-digital converter (TDC) configured to receive the first clock signal, to compare a phase of the first clock signal to a phase of a reference clock signal, and to generate digital representation of a phase difference between the first clock signal and the reference clock signal, a digital phase detector configured to compare the digital representation of the phase different with a programmed phase difference and to provide an phase error signal based on the comparison of the digital representation of the phase with the programmed phase difference, and a digital loop filter configured to receive the error signal and adjust parameters of the DCO.

In Example 5, the equalization circuit of any one or more of Examples 1-4 optionally includes an adaptive filter configured to conform a shape of the digital representation of the phase noise of the DPLL at the second mixer to a shape of the phase noise of the DPLL at the first mixer.

In Example 6, the circuit of any one or more of Examples 1-5 optionally includes a second DPLL configured to provide a second clock signal to the ADC.

In Example 7, the circuit of any one or more of Examples 1-6 optionally includes a second compensation circuit configured to receive phase error information from the second DPLL and to apply a second phase compensation signal to the digital information via a third mixer to reduce phase noise from the second DPLL in the digital information.

In Example 8, the third mixer of any one or more of Examples 1-7 optionally is a digital mixer, In Example 9, the first mixer of any one or more of Examples 1-8 optionally is an analog mixer.

In Example 10, the second mixer of any one or more of Examples 1-9 optionally is a digital mixer.

In Example 11, a method of compensating for phase noise can include receiving a modulated signal at an analog mixer, receiving a clock signal at the analog mixer, converting an analog output of the analog mixer to a digital signal, digitally estimating phase noise of the clock signal to provide a digital estimate of the phase noise of the clock signal, and applying the digital estimate of the phase noise to the digital signal using a digital mixer to reduce phase noise in the digital signal.

In Example 12, the applying the digital estimate of any one or more of Examples 1-11 optionally includes rotating a constellation reference frame of the digital signal using the digital estimate.

In Example 13, the receiving a clock signal at the analog mixer of any one or more of Examples 1-12 optionally includes generating a clock signal using a digital phase lock loop (DPLL).

In Example 14, the generating the clock signal of any one or more of Examples 1-13 optionally includes generating an estimate of the phase noise of the clock signal at a time-to-digital converter (TDC) of the DPLL.

In Example 15, the generating the clock signal includes of any one or more of Examples 1-14 optionally generating an estimate of the phase noise of the clock signal at a digital phase detector (DPD) of the DPLL.

In Example 16, the applying the digital estimate of phase noise of any one or more of Examples 1-17 optionally includes resampling the estimate of the phase noise from the DPLL to conform a sampling rate of the estimate of phase noise to a sampling rate of the ADC.

In Example 17, the applying the digital estimate of phase noise of any one or more of Examples 1-16 optionally includes shaping the digital estimate of phase noise to match a shape of the phase noise of the DPLL applied at the analog mixer.

In Example 18, a method for modulating performance of a phase lock loop (PLL) of a user equipment (UE) to save power can include entering an idle mode of the UE on a wireless network, selecting a first performance mode of the PLL, determining a channel-state level of the wireless network based on page data received from the wireless network during the idle mode, receiving an indication of a connected mode of the UE on the wireless network, and if the channel state level satisfies a first threshold, selecting a second performance mode of the PLL, the second performance mode configured to process a higher order modulation of wireless network than the first performance mode.

In Example 19, the channel-state level includes of any one or more of Examples 1-18 optionally a reference signal measurement of the UE.

In Example 20, the reference signal measurement of any one or more of Examples 1-19 optionally includes reference signal received power (RSRP).

In Example 21, the reference signal measurement of any one or more of Examples 1-20 optionally includes reference signal received quality (RSRQ).

In Example 22, the method of any one or more of Examples 1-21 optionally includes entering a connected mode of the UE.

In Example 23, the method of any one or more of Examples 1-2 optionally includes measuring a resource management parameter of the network while decoding symbols of a shared channel.

In Example 24, the resource management parameter of any one or more of Examples 1-23 optionally is a channel quality indicator (CQI) while decoding symbols of a physical downlink shared channel (PDSCH).

In Example 25, the method of any one or more of Examples 1-24 optionally includes, if the PLL is in the second performance mode and the CQI fails to meet a CQI threshold, selecting the first performance mode of the PLL.

In Example 26, the selecting the first performance mode of the PLL of any one or more of Examples 1-25 optionally includes selecting the first performance mode of the PLL during a reception gap of the UE.

In Example 27, the method of any one or more of Examples 1-26 optionally includes, if the PLL is in the first performance mode and the CQI meets a CQI threshold, selecting the second performance mode of the PLL.

In Example 28, the method of any one or more of Examples 1-2 optionally includes, if the PLL is in the first performance mode and the CQI meets a CQI threshold, selecting the second performance mode of the PLL during a reception gap of the UE.

In Example 29, the method of any one or more of Examples 1-28 optionally includes collecting, at the UE, a historical record of higher modulation events of the network, determining, at the UE, times and corresponding probabilities of a subsequent higher modulation event of the network based on the historical record, and selecting the second performance mode of the PLL at the times when the corresponding probability meets or exceeds a threshold probability.

In Example 30, the method of any one or more of Examples 1-29 optionally includes, if the channel state level does not satisfy the first threshold, transitioning from the second performance mode of the PLL to the first performance mode.

In Example 31, the first threshold of any one or more of Examples 1-30 optionally is a hysteretic threshold.

In Example 32, the method of any one or more of Examples 1-2 optionally includes, after connecting to a network, determining the network operator and looking up a maximum modulation order for the network operator.

In Example 33, the method of any one or more of Examples 1-2 optionally includes maintaining a first performance mode of the PLL if the maximum modulation order is less than a modulation order threshold.

In Example 34, the modulation order threshold of any one or more of Examples 1-33 optionally is 64 QAM or less.

In Example 35, a multiple-mode digital phase lock loop can include a digital PLL, multiple frequency scalers configured to receive a reference clock, and a multiplexer configured to receive a mode command signal and to couple an output of one of the multiple frequency scalers to an input of the digital PLL in response to a state of the mode command signal.

In Example 36, a first frequency scaler of the multiple frequency scalers of any one or more of Examples 1-35 optionally includes a multiplier circuit configured to provide an output signal having a higher frequency than the frequency of the reference clock.

In Example 37, a first frequency scaler of the multiple frequency scalers of any one or more of Examples 1-34 optionally includes a divider circuit configured to provide an output signal having a lower frequency than the frequency of the reference clock.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B." unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. A circuit for cancelling phase noise, the circuit comprising:
   a first mixer configured to receive a modulated signal;
   a digital phase-lock loop (DPLL) configured to provide a first clock signal to the first mixer and to provide a phase noise estimate of phase noise of the DPLL;
   an analog-to-digital converter (ADC) configured to receive an output of the first mixer and provide digital information of the modulated signal; and
   an equalization circuit configured to receive the phase noise estimate from the DPLL and to apply a digital representation of the phase noise of the DPLL to the digital information via a second mixer to reduce phase noise of digital information,
   wherein the DPLL comprises a time-to-digital converter (TDC) in a feedback path of the DPLL, the TDC configured to receive the first clock signal and a reference clock signal and generate a digital representation of a phase difference between the first clock signal and the reference clock signal, and
   wherein the phase noise estimate is generated by the DPLL based on a comparison of the digital representation of the phase difference with a predetermined phase difference and parameters of the first clock signal are adjusted based on the phase noise estimate.

2. The circuit of claim 1, wherein the equalization circuit includes a resample circuit configured to sample the phase noise estimate at a rate corresponding to a rate of the ADC to compensate for the phase noise, the phase noise comprising a random, non-deterministic component of phase error.

3. The circuit of claim 1, wherein the TDC is configured to receive the first clock signal, to compare a phase of the first clock signal to a phase of the reference clock signal, and to generate the digital representation of the phase difference between the first clock signal and the reference clock signal based on the comparison, and
   wherein the DPLL comprises:
   a digitally controlled oscillator (DCO) configured to provide the first clock signal;
   a digital phase detector in the feedback path configured to compare the digital representation of the phase difference with a predetermined phase difference to generate the phase noise estimate; and
   a digital loop filter configured to receive the phase noise estimate for use in adjusting parameters of the DCO, and
   wherein the resample circuit is configured to sample the phase noise estimate from the digital phase detector at a rate corresponding to a rate of the ADC.

4. The circuit of claim 1, wherein the first mixer is an analog mixer.

5. The circuit of claim 1, wherein the second mixer is a digital mixer.

6. A circuit for cancelling phase noise, the circuit comprising:
   a first mixer configured to receive a modulated signal;
   a digital phase-lock loop (DPLL) configured to provide a first clock signal to the first mixer and to provide a phase noise estimate of phase noise of the DPLL;
   an analog-to-digital converter (ADC) configured to receive an output of an analog mixer and provide digital information of the modulated signal;
   an equalization circuit configured to receive the phase noise estimate from the DPLL and to apply a digital representation of the phase noise of the DPLL to the digital information via a second mixer to reduce phase noise of digital information,
   wherein the equalization circuit includes a resample circuit configured to sample the phase noise estimate from a digital phase detector of the DPLL at a rate corresponding to a rate of the ADC, and
   wherein the DPLL includes:
   a digitally controlled oscillator (DCO) configured to provide the first clock signal;
   the time-to-digital converter (TDC) configured to receive the first clock signal, to compare a phase of the first clock signal to a phase of a reference clock signal, and to generate digital representation of a phase difference between the first clock signal and the reference clock signal;
   a digital phase detector configured to compare the digital representation of the phase difference with a programmed phase difference and to provide an phase error signal based on the comparison of the digital representation of the phase with the programmed phase difference; and
   a digital loop filter configured to receive the error signal and adjust parameters of the DCO.

7. A circuit for cancelling phase noise, the circuit comprising:
   a first mixer configured to receive a modulated signal;
   a digital phase-lock loop (DPLL) configured to provide a first clock signal to the first mixer and to provide a phase noise estimate of phase noise of the DPLL;
   an analog-to-digital converter (ADC) configured to receive an output of the first mixer and provide digital information of the modulated signal;

an equalization circuit configured to receive the phase noise estimate from the DPLL and to apply a digital representation of the phase noise of the DPLL to the digital information via a second mixer to reduce phase noise of digital information, wherein the equalization circuit includes a resample circuit configured to sample the phase noise estimate from a digital phase detector of the DPLL at a rate corresponding to a rate of the ADC, and wherein the equalization circuit includes an adaptive filter configured to conform a shape of the digital representation of the phase noise of the DPLL at the second mixer to a shape of the phase noise of the DPLL at the first mixer.

8. A circuit for cancelling phase noise, the circuit comprising:
   a first mixer configured to receive a modulated signal;
   a digital phase-lock loop (DPLL) configured to provide a first clock signal to the first mixer and to provide a phase noise estimate of phase noise of the DPLL;
   an analog-to-digital converter (ADC) configured to receive an output of the first mixer and provide digital information of the modulated signal;
   an equalization circuit configured to receive the phase noise estimate from the DPLL and to apply a digital representation of the phase noise of the DPLL to the digital information via a second mixer to reduce phase noise of digital information; and,
   a second DPLL configured to provide a second clock signal to the ADC, wherein the second DPLL is different from the DPLL.

9. The circuit of claim 8, including a second compensation circuit configured to receive phase error information from the second DPLL and to apply a second phase compensation signal to the digital information via a third mixer to reduce phase noise from the second DPLL in the digital information.

10. The circuit of claim 9, wherein the third mixer is a digital mixer.

11. A method of compensating for phase noise, the phase noise comprising a random, non-deterministic component of phase error, the method comprising:

receiving a modulated signal at an analog mixer;

receiving a clock signal at the analog mixer;

converting an analog output of the analog mixer to a digital signal;

digitally estimating phase noise of the clock signal to provide a digital estimate of the phase noise of the clock signal; and applying the digital estimate of the phase noise to the digital signal using a digital mixer to reduce phase noise in the digital signal, wherein receiving a clock signal at the analog mixer includes generating a clock signal using a digital phase lock loop (DPLL), and wherein generating the clock signal includes generating an estimate of the phase noise of the clock signal at a time-to-digital converter (TDC) of the DPLL, wherein the TDC configured to receive the first clock signal and a reference clock signal and generate a digital representation of a phase difference between the clock signal and the reference clock signal, wherein the phase noise estimate is generated by the DPLL based on a comparison of the digital representation of the phase difference with a predetermined phase difference, and parameters of the first clock signal are adjusted based on the phase noise estimate, and wherein a digital representation of the phase noise of the DPLL is applied to the digital information via the digital mixer to reduce phase noise of digital information.

12. The method of claim 11, wherein generating the clock signal includes generating an estimate of the phase noise of the clock signal at a digital phase detector (DPD) of the DPLL.

13. The method of claim 11, wherein applying the digital estimate of phase noise includes resampling the estimate of the phase noise from the DPLL to conform a sampling rate of the estimate of phase noise to a sampling rate of the ADC.

* * * * *